United States Patent
Shao

(10) Patent No.: US 12,276,994 B2
(45) Date of Patent: Apr. 15, 2025

(54) REGULATOR CIRCUIT MODULE, MEMORY STORAGE DEVICE, AND VOLTAGE CONTROL METHOD

(71) Applicant: PHISON ELECTRONICS CORP., Miaoli (TW)

(72) Inventor: Pi-Huang Shao, Hsinchu County (TW)

(73) Assignee: PHISON ELECTONICS CORP., Miaoli (TW)

(*) Notice: Subject to any disclaimer, the term of this patent is extended or adjusted under 35 U.S.C. 154(b) by 302 days.

(21) Appl. No.: 18/179,366

(22) Filed: Mar. 7, 2023

(65) Prior Publication Data
US 2024/0264620 A1    Aug. 8, 2024

(30) Foreign Application Priority Data

Feb. 3, 2023    (TW) ................................ 112103848

(51) Int. Cl.
| | | |
|---|---|---|
| G11C 11/417 | (2006.01) | |
| G05F 1/575 | (2006.01) | |
| G05F 3/26 | (2006.01) | |
| G11C 16/30 | (2006.01) | |
| G11C 16/04 | (2006.01) | |

(52) U.S. Cl.
CPC .............. G05F 1/575 (2013.01); G05F 3/262 (2013.01); G11C 16/30 (2013.01); *G11C 16/0483* (2013.01)

(58) Field of Classification Search
CPC ......... G05F 1/575; G05F 3/262; G11C 16/30; G11C 16/0483
See application file for complete search history.

(56) References Cited

U.S. PATENT DOCUMENTS

| | | | | |
|---|---|---|---|---|
| 2007/0140003 A1* | 6/2007 | Ido | ............................ | G11C 8/08 365/185.2 |
| 2007/0280021 A1* | 12/2007 | Ueda | ........................ | G11C 7/065 365/158 |
| 2008/0192537 A1* | 8/2008 | Kasuta | .................... | G11C 16/28 365/185.2 |
| 2010/0054042 A1* | 3/2010 | Miki | ........................ | G11C 29/02 365/208 |
| 2011/0050196 A1* | 3/2011 | Fuse | .......................... | G11C 7/14 323/312 |
| 2012/0314478 A1* | 12/2012 | Ha | ........................ | G11C 13/003 365/158 |

FOREIGN PATENT DOCUMENTS

TW    I371671    9/2012

OTHER PUBLICATIONS

"Office Action of Taiwan Counterpart Application", issued on Oct. 30, 2023, p. 1-p. 12.

* cited by examiner

*Primary Examiner* — Hien N Nguyen
(74) *Attorney, Agent, or Firm* — JCIPRNET

(57) ABSTRACT

A regulator circuit module, a memory storage device, and a voltage control method are provided. The regulator circuit module includes a regulator circuit, a compensating circuit, a mirror circuit, and a switch circuit. The regulator circuit is configured to generate a first voltage and a second voltage according to a reference voltage. The switch circuit is configured to turn on or cut off the compensating circuit according to a voltage difference between the first voltage and a control voltage. The mirror circuit is configured to generate the control voltage according to the second voltage.

33 Claims, 7 Drawing Sheets

REGULATOR CIRCUIT MODULE, MEMORY STORAGE DEVICE, AND VOLTAGE CONTROL METHOD

CROSS-REFERENCE TO RELATED APPLICATION

This application claims the priority benefit of Taiwan application serial no. 112103848, filed on Feb. 3, 2023. The entirety of the above-mentioned patent application is hereby incorporated by reference herein and made a part of this specification.

BACKGROUND

Technical Field

The disclosure relates to a voltage control technology, and in particular to a regulator circuit module, a memory storage device, and a voltage control method.

Description of Related Art

The regulator circuit module such as a low dropout regulator (LDO) is gradually applied in the packaging structure of a memory control chip to improve the operating reliability of the memory control chip. Generally speaking, the electrical parameters used by various regulator circuit modules are preset before leaving the factory to meet most usage requirements. However, in practice, the performance of electronic elements inside the regulator circuit module is easily affected by factors such as ambient temperature or process errors, thereby causing a decrease in the operating efficiency of the regulator circuit module. In particular, for the switch circuit that requires precise control inside the regulator circuit module, it is even more necessary to have the ability to operate stably under different environments or operating conditions.

SUMMARY

The disclosure provides a regulator circuit module, a memory storage device, and a voltage control method, which can improve the operating stability of a switch circuit inside the regulator circuit module.

An exemplary embodiment of the disclosure provides a regulator circuit module, which includes a regulator circuit, a compensating circuit, a mirror circuit, and a switch circuit. The switch circuit is coupled to the regulator circuit, the compensating circuit, and the mirror circuit. The regulator circuit is configured to generate a first voltage and a second voltage according to a reference voltage. The switch circuit is configured to turn on or cut off the compensating circuit according to a voltage difference between the first voltage and a control voltage. The mirror circuit is configured to generate the control voltage according to the second voltage.

An exemplary embodiment of the disclosure further provides a memory storage device, which includes a connection interface unit, a rewritable non-volatile memory module, a memory control circuit unit, and a regulator circuit module. The connection interface unit is configured to couple to a host system. The regulator circuit module is coupled to at least one of the connection interface unit, the rewritable non-volatile memory module, and the memory control circuit unit. The regulator circuit module is configured to execute the following. A first voltage and a second voltage are generated by a regulator circuit according to a reference voltage. A compensating circuit is turned on or cut off by a switch circuit according to a voltage difference between the first voltage and a control voltage. The control voltage is generated according to the second voltage.

An exemplary embodiment of the disclosure further provides a voltage control method, which is applied to a regulator circuit module. The voltage control method includes the following steps. A first voltage and a second voltage are generated by a regulator circuit according to a reference voltage. A compensating circuit is turned on or cut off by a switch circuit according to a voltage difference between the first voltage and a control voltage. The control voltage is generated according to the second voltage.

Based on the above, after the regulator circuit generates the first voltage and the second voltage according to the reference voltage, the mirror circuit may generate the control voltage according to the second voltage. In addition, the switch circuit may turn on or cut off the compensating circuit according to the voltage difference between the first voltage and the control voltage. Thereby, the operating stability of the switch circuit inside the regulator circuit module can be effectively improved.

DETAILED DESCRIPTION OF DISCLOSED EMBODIMENTS

Several exemplary embodiments are proposed below to illustrate the disclosure, but the disclosure is not limited to the illustrated exemplary embodiments. Appropriate combinations are also allowed among the exemplary embodiments. The term "coupling" used in the entire specification (including the claims) of the disclosure may refer to any direct or indirect connection means. For example, if a first device is described as being coupled to a second device, it should be interpreted that the first device may be directly connected to the second device or the first device may be indirectly connected to the second device through another device or certain connection means. In addition, the term "signal" may refer to at least one current, voltage, charge, temperature, data, or any other signal or signals.

Figure 1:
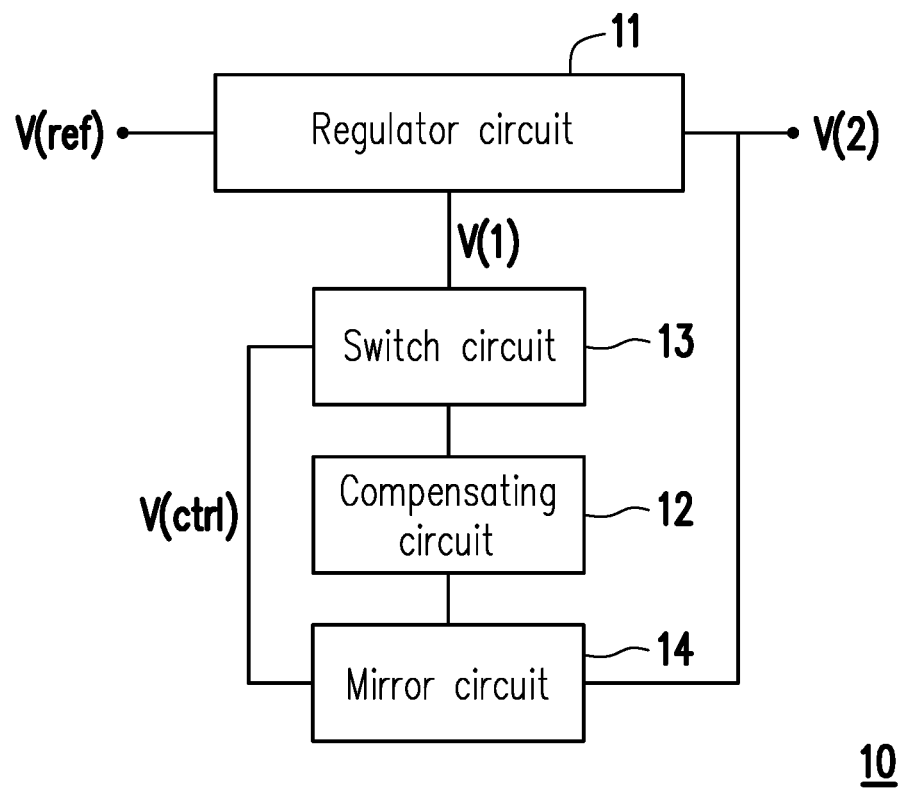
FIG. 1 is a schematic diagram of a regulator circuit module according to an exemplary embodiment of the disclosure.

FIG. 1 is a schematic diagram of a regulator circuit module according to an exemplary embodiment of the disclosure. Please refer to FIG. 1. A regulator circuit module 10 may be implemented in a low dropout regulator (LDO) or a similar voltage control circuit module.

The regulator circuit module 10 includes a regulator circuit 11, a compensating circuit 12, a switch circuit 13, and a mirror circuit 14. The regulator circuit 11 may generate a voltage (also referred to as a first voltage) V(1) and a voltage (also referred to as a second voltage) V(2) according to a voltage (also referred to as a reference voltage) V(ref). The voltage V(2) may be used as an output voltage of the regulator circuit 11 and provided to an external load.

The compensating circuit 12 may be coupled to the regulator circuit 11 via the switch circuit 13. The compensating circuit 12 may be configured to compensate a frequency response of the regulator circuit 11. For example, the compensating circuit 12 may compensate a high frequency response of the regulator circuit 11 via the switch circuit 13. In an exemplary embodiment, the compensating circuit 12 may include at least one impedance element. In an exemplary embodiment, the compensating circuit 12 may include at least one impedance element and at least one capacitance element connected in series.

The switch circuit 13 is coupled to the regulator circuit 11, the compensating circuit 12, and the mirror circuit 14. The switch circuit 13 may receive the voltage V(1) and a voltage (also referred to as a control circuit) V(ctrl). The switch circuit 13 may turn on or cut off the compensating circuit 12 according to a voltage difference between the voltage V(1) and the voltage V(ctrl). For example, the switch circuit 13 may turn on or cut off the compensating circuit 12 according to whether the voltage difference between the voltage V(1) and the voltage V(ctrl) meets a specific condition. For example, in response to the voltage difference between the voltage V(1) and the voltage V(ctrl) meeting the specific condition, the switch circuit 13 may turn on the compensating circuit 12 (that is, turn on the compensating circuit 12 to the regulator circuit 11). Alternatively, in response to the voltage difference not meeting the specific condition, the switch circuit 13 may cut off the compensating circuit 12 (that is, cut off the compensating circuit 12 from the regulator circuit 11).

In an exemplary embodiment, in the case where the compensating circuit 12 is turned on, the compensating circuit 12 may compensate the frequency response (for example, high frequency response) of the regulator circuit 11. In addition, in the case where the compensating circuit 12 is cut off, the compensating circuit 12 cannot compensate the frequency response of the regulator circuit 11.

In an exemplary embodiment, the case where the voltage difference between the voltage V(1) and the voltage V(ctrl) meets the specific condition includes the case where the voltage difference between the voltage V(1) and the voltage V(ctrl) is greater than a threshold. In an exemplary embodiment, in response to the voltage difference between the voltage V(1) and the voltage V(ctrl) being greater than the threshold, the switch circuit 13 may turn on the compensating circuit 12. Conversely, in response to the voltage difference between the voltage V(1) and the voltage V(ctrl) not being greater than the threshold (indicating that the voltage difference between the voltage V(1) and the voltage V(ctrl) does not meet the specific condition), the switch circuit 13 may cut off the compensating circuit 12. In addition, the threshold may be set according to practical requirements, which is not limited in the disclosure.

Traditionally, the voltage value of the voltage V(ctrl) is predetermined according to the element characteristics of the switch circuit 13 before the regulator circuit module 10 leaves the factory and cannot be dynamically adjusted during the subsequent operating process of the regulator circuit module 10. After the regulator circuit module 10 leaves the factory, a voltage source may provide the voltage V(ctrl) to the switch circuit 13 according to the predetermined voltage value. The switch circuit 13 may automatically turn on or cut off the compensating circuit 12 according to the voltage difference between the voltage V(ctrl) and the variable voltage V(1).

However, in practice, the element characteristics of the switch circuit 13 may be affected by factors such as ambient temperature or process errors and change. At this time, if the voltage V(ctrl) is not dynamically adjusted along with the change in the element characteristics of the switch circuit 13, the accuracy of the subsequent action of the switch circuit 13 will decrease. For example, after the element characteristics of the switch circuit 13 change, in the case where the compensating circuit 12 is preset to be turned on, the switch circuit 13 may continue with the status of keeping the compensating circuit 12 cut off. At this time, the compensating circuit 12 is not turned on to the regulator circuit 11, so the quality of the voltage V(2) may decrease. Alternatively, after the element characteristics of the switch circuit 13 change, in the case where the compensating circuit 12 is preset to be cut off, the switch circuit 13 may continue with the status of turning on the compensating circuit 12 to the regulator circuit 11. At this time, the compensating circuit 12 is turned on in the case where the compensating circuit 12 should not be turned on, so the quality of the voltage V(2) may also decrease. In an exemplary embodiment, the regulator circuit module 10 can improve the above issues.

In an exemplary embodiment, the mirror circuit 14 may receive the voltage V(2) and generate (including control or adjust) the voltage V(ctrl) according to the voltage V(2). In particular, through the control of the mirror circuit 14, even if the element characteristics of the switch circuit 13 are affected by factors such as ambient temperature or process errors, the voltage V(ctrl) may still be adjusted to an appropriate voltage value according to the current element characteristics of the switch circuit 13 to meet the original control requirements of the switch circuit 13. For example, when the element characteristics of the switch circuit 13 are affected by factors such as ambient temperature or process errors, making it more difficult for the switch circuit 13 to turn on the compensating circuit 12, the mirror circuit 14 may dynamically reduce the voltage value of the voltage V(ctrl). In response to the reduction of the voltage value of the voltage V(ctrl), the switch circuit 13 may more easily turn on the compensating circuit 12 to meet the original control requirements of the switch circuit 13. Alternatively, when the element characteristics of the switch circuit 13 are affected by factors such as ambient temperature or process errors, making it too easy for the switch circuit 13 to turn on the compensating circuit 12, the mirror circuit 14 may dynamically increase the voltage value of the voltage V(ctrl). In response to the increase of the voltage value of the voltage V(ctrl), the difficulty for the switch circuit 13 to turn on the compensating circuit 12 may be increased to meet the original control requirements of the switch circuit 13. In other words, through dynamically adjusting the voltage V(ctrl), even if the element characteristics of the switch circuit 13 change due to factors such as ambient temperature or process errors, the operating stability of the switch circuit 13 can still be effectively maintained.

Figure 2:
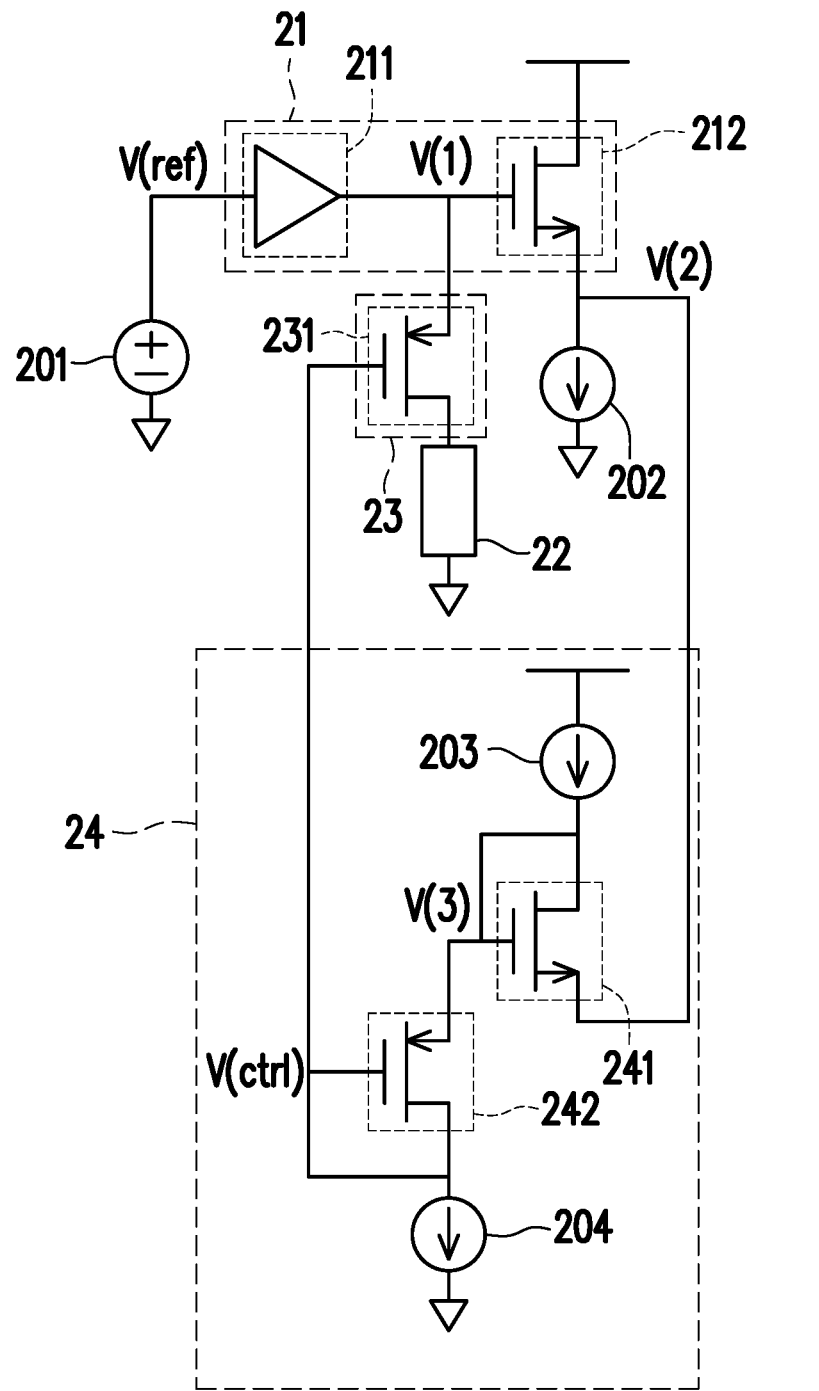
FIG. 2 is a schematic diagram of a regulator circuit module according to an exemplary embodiment of the disclosure.

FIG. 2 is a schematic diagram of a regulator circuit module according to an exemplary embodiment of the disclosure. Please refer to FIG. 2. A regulator circuit module 20 includes a regulator circuit 21, a compensating circuit 22, a switch circuit 23, and a mirror circuit 24.

The regulator circuit 21 includes an operational amplifier 211 and a transistor element (also referred to as a first transistor element) 212. An input terminal of the operational amplifier 211 is coupled to a voltage source 201. An output terminal of the operational amplifier 211 is coupled to the transistor element 212 and the switch circuit 23. The operational amplifier 211 may receive the voltage V(ref) from the voltage source 201. The operational amplifier 211 may generate the voltage V(1) at the output terminal of the operational amplifier 211 according to the voltage V(ref).

A gate (G) terminal of the transistor element 212 is coupled to the output terminal of the operational amplifier 211. A source (S) terminal of the transistor element 212 is coupled to the mirror circuit 24 and a current source 202. A drain (D) terminal of the transistor element 212 is coupled to a reference ground voltage. The transistor element 212 may receive the voltage V(1) via the gate (G) terminal of the transistor element 212. The transistor element 212 may output the voltage V(2) via the source (S) terminal of the transistor element 212 according to the voltage V(1).

The compensating circuit 22 is coupled to the switch circuit 23. In the case where the compensating circuit 22 is turned on to the regulator circuit 21, the compensating circuit 22 may be configured to compensate the frequency response (for example, the high frequency response) of the regulator circuit 21. Furthermore, in the case where the compensating circuit 22 is not turned on to the regulator circuit 21 (that is, cut off from the regulator circuit 21), the compensating circuit 22 does not compensate the frequency response of the regulator circuit 21.

The switch circuit 23 is coupled to the regulator circuit 21, the compensating circuit 22, and the mirror circuit 24. The switch circuit 23 includes a transistor element (also referred to as a second transistor element) 231. A source (S) terminal of the transistor element 231 is coupled to the regulator circuit 21. A gate (G) terminal of the transistor element 231 is coupled to the mirror circuit 24. A drain (D) terminal of the transistor element 231 is coupled to the compensating circuit 22.

The transistor element 231 may receive the voltage V(1) via the source (S) terminal of the transistor element 231. The transistor element 231 may receive the voltage V(ctrl) via the gate (G) terminal of the transistor element 231. According to the voltage difference between the voltage V(1) and the voltage V(ctrl), the transistor element 231 may turn on or cut off the compensating circuit 22. For example, in response to the voltage difference between the voltage V(1) and the voltage V(ctrl) being greater than the threshold, the transistor element 231 may turn on the compensating circuit 22. Alternatively, in response to the voltage difference between the voltage V(1) and the voltage V(ctrl) not being greater than the threshold, the transistor element 231 may cut off the compensating circuit 22. In an exemplary embodiment, the voltage V(ctrl) is also referred to as a gate voltage of the transistor element 231. In addition, the threshold may be affected by the material characteristics and/or the electrical changes of the transistor element 231.

The mirror circuit 24 is coupled to the regulator circuit 21 and the switch circuit 23. The mirror circuit 24 includes a transistor element (also referred to as a third transistor element) 241 and a transistor element (also referred to as a fourth transistor element) 242. A source (S) terminal of the transistor element 241 is coupled to the regulator circuit 21 (for example, the source (S) terminal of the transistor element 212). A drain (D) terminal of the transistor element 241 is coupled to a current source 203. A gate (G) terminal of the transistor element 241 is coupled to a source (S) terminal of the transistor element 242. A gate (G) terminal of the transistor element 242 is coupled to the switch circuit 23 (for example, the gate (G) terminal of the transistor element 231). A drain (D) terminal of the transistor element 242 is coupled to a current source 204.

The transistor element 241 may receive the voltage V(2) via the source (S) terminal of the transistor element 241. The transistor element 241 may generate a voltage (also referred to as a third voltage) V(3) via the gate (G) terminal of the transistor element 241 according to the voltage V(2). The transistor element 242 may receive the voltage V(3) via the source (S) terminal of the transistor element 242. The transistor element 242 may generate the voltage V(ctrl) via the gate (G) terminal of the transistor element 242 according to the voltage V(3).

It should be noted that the configurations of the transistor elements 241 and 242 correspond to the configurations of the transistor elements 212 and 231. Therefore, the transistor elements 241 and 242 may be used as mirror circuits of the transistor elements 212 and 231. Under the same operating environment (for example, ambient temperature and/or process errors), the transistor elements 241 and 242 may dynamically control the voltage V(ctrl) according to the voltage V(2) to reflect possible characteristic changes of the transistor element 231 (and 212) under the current operating environment. Compared with the traditionally fixed voltage V(ctrl), using the dynamically adjustable voltage V(ctrl) to control the transistor element 231 can improve the operating stability of the transistor element 231 (or the switch circuit 23).

Figure 3:
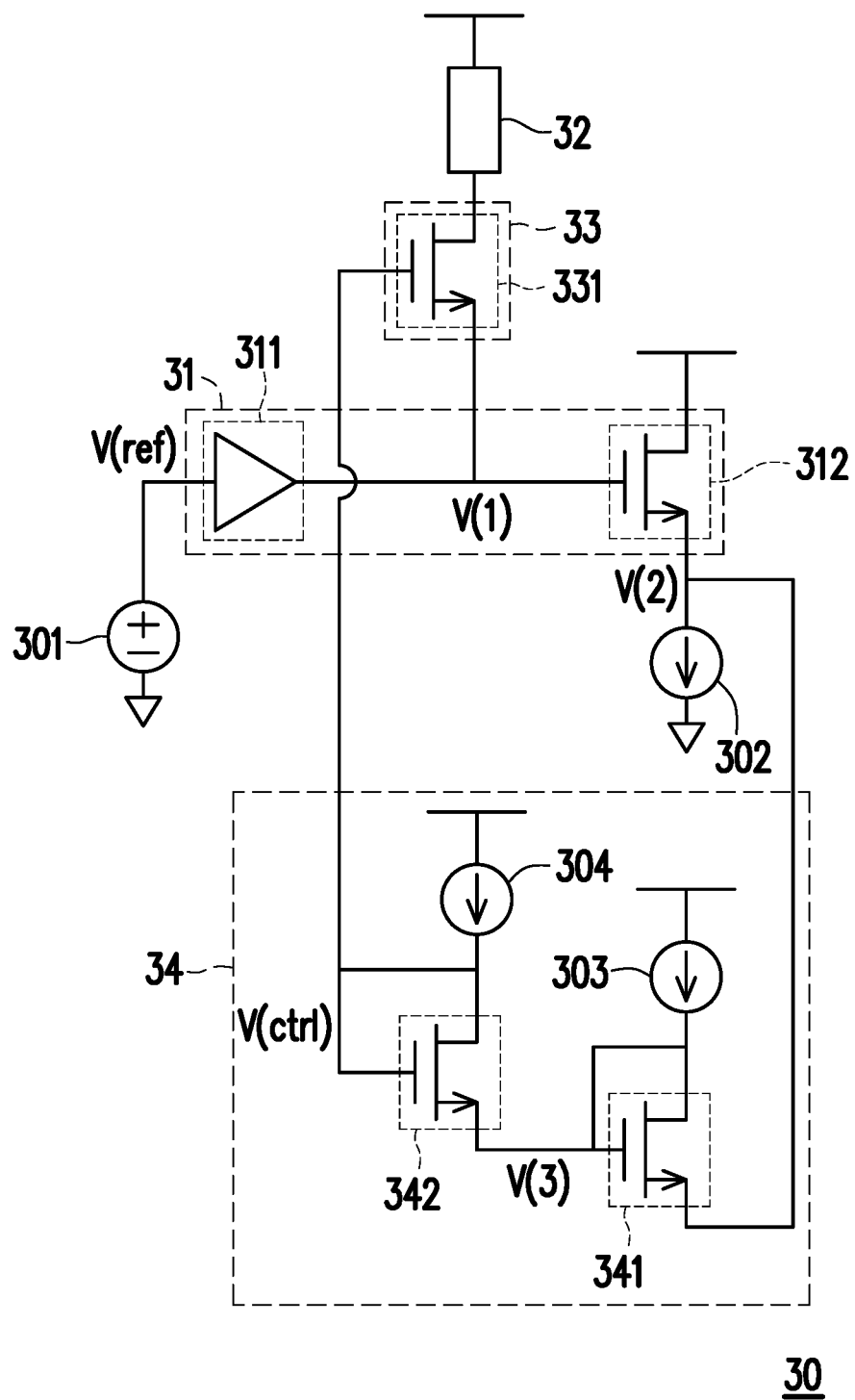
FIG. 3 is a schematic diagram of a regulator circuit module according to an exemplary embodiment of the disclosure.

FIG. 3 is a schematic diagram of a regulator circuit module according to an exemplary embodiment of the disclosure. Please refer to FIG. 3. A regulator circuit module 30 includes a regulator circuit 31, a compensating circuit 32, a switch circuit 33, and a mirror circuit 34.

The regulator circuit 31 includes an operational amplifier 311 and a transistor element 312 (that is, a second transistor element). An input terminal of the operational amplifier 311 is coupled to a voltage source 301. An output terminal of the operational amplifier 311 is coupled to the transistor element 312 and the switch circuit 33. The operational amplifier 311 may receive the voltage V(ref) from the voltage source 301. The operational amplifier 311 may generate the voltage V(1) at the output terminal of the operational amplifier 311 according to the voltage V(ref).

A gate (G) terminal of the transistor element 312 is coupled to the output terminal of the operational amplifier 311. A source (S) terminal of the transistor element 312 is coupled to the mirror circuit 34 and a current source 302. A drain (D) terminal of the transistor element 312 is coupled to the reference ground voltage. The transistor element 312 may receive the voltage V(1) via the gate (G) terminal of the transistor element 312. The transistor element 312 may output the voltage V(2) via the source (S) terminal of the transistor element 312 according to the voltage V(1).

The compensating circuit 32 is coupled to the switch circuit 33. In the case where the compensating circuit 32 is turned on to the regulator circuit 31, the compensating circuit 32 may be configured to compensate the frequency response (for example, the high frequency response) of the regulator circuit 31. Furthermore, in the case where the compensating circuit 32 is not turned on to the regulator circuit 31 (that is, cut off from the regulator circuit 31), the compensating circuit 32 does not compensate the frequency response of the regulator circuit 31.

The switch circuit 33 is coupled to the regulator circuit 31, the compensating circuit 32, and the mirror circuit 34. The switch circuit 33 includes a transistor element 331 (that is, a second transistor element). A source (S) terminal of the transistor element 331 is coupled to the regulator circuit 31. A gate (G) terminal of the transistor element 331 is coupled to the mirror circuit 34. A drain (D) terminal of the transistor element 331 is coupled to the compensating circuit 32.

The transistor element 331 may receive the voltage V(1) via the source (S) terminal of the transistor element 331. The transistor element 331 may receive the voltage V(ctrl) via the gate (G) terminal of the transistor element 331. According to the voltage difference between the voltage V(1) and the voltage V(ctrl), the transistor element 331 may turn on or cut off the compensating circuit 32. In an exemplary embodiment, the voltage V(ctrl) is also referred to as a gate voltage of the transistor element 331. In addition, the threshold may be affected by the material characteristics and/or the electrical changes of the transistor element 331.

The mirror circuit 34 is coupled to the regulator circuit 31 and the switch circuit 33. The mirror circuit 34 includes a transistor element 341 (that is, a third transistor element) and a transistor element 342 (that is, a fourth transistor element). A source (S) terminal of the transistor element 341 is coupled to the regulator circuit 31 (for example, the source (S) terminal of the transistor element 312). A drain (D) terminal of the transistor element 341 is coupled to a current source 303. A gate (G) terminal of the transistor element 341 is coupled to a source (S) terminal of the transistor element 342. A gate (G) terminal of the transistor element 342 is coupled to the switch circuit 33 (for example, the gate (G) terminal of the transistor element 331). A drain (D) terminal of the transistor element 342 is coupled to a current source 304.

The transistor element 341 may receive the voltage V(2) via the source (S) terminal of the transistor element 341. The transistor element 341 may generate the voltage V(3) via the gate (G) terminal of the transistor element 341 according to the voltage V(2). The transistor element 342 may receive the voltage V(3) via the source (S) terminal of the transistor element 342. The transistor element 242 may generate the voltage V(ctrl) via the gate (G) terminal of the transistor element 342 according to the voltage V(3).

Similar to the exemplary embodiment of FIG. 2, in the exemplary embodiment of FIG. 3, the configurations of the transistor elements 341 and 342 correspond to the configurations of the transistor elements 312 and 331. Therefore, the transistor elements 341 and 342 may be used as mirror circuits of the transistor elements 312 and 331. Under the same operating environment (for example, ambient temperature and/or process errors), the transistor elements 341 and 342 may dynamically control the voltage V(ctrl) according to the voltage V(2) to reflect possible characteristic changes of the transistor element 331 (and 312) under the current operating environment, thereby improving the operating stability of the transistor element 331 (or the switch circuit 33).

Figure 4:
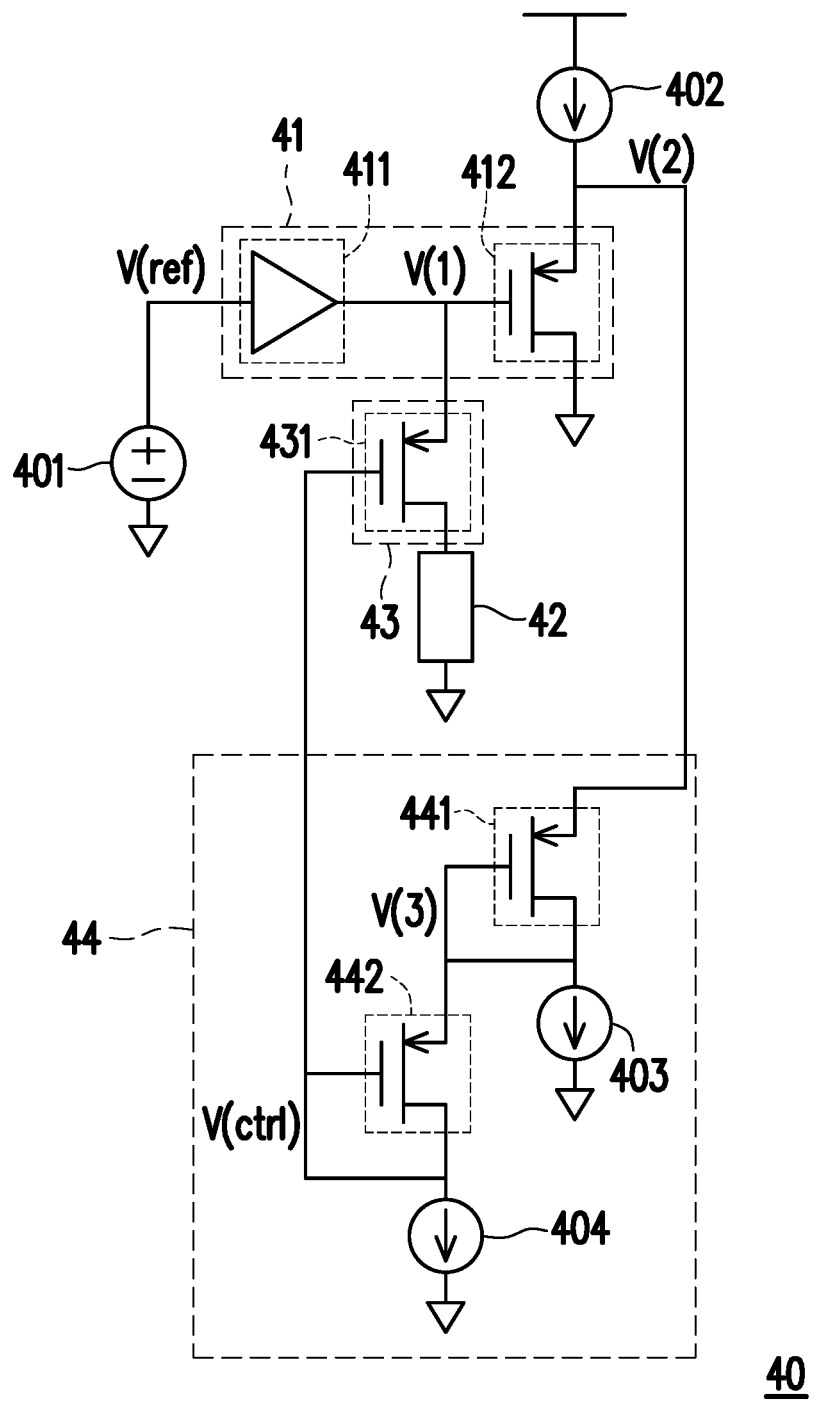
FIG. 4 is a schematic diagram of a regulator circuit module according to an exemplary embodiment of the disclosure.

FIG. 4 is a schematic diagram of a regulator circuit module according to an exemplary embodiment of the disclosure. Please refer to FIG. 4. A regulator circuit module 40 includes a regulator circuit 41, a compensating circuit 42, a switch circuit 43, and a mirror circuit 44.

The regulator circuit 41 includes an operational amplifier 411 and a transistor element 412 (that is, a second transistor element). An input terminal of the operational amplifier 411 is coupled to a voltage source 401. An output terminal of the operational amplifier 411 is coupled to the transistor element 412 and the switch circuit 43. The operational amplifier 411 may receive the voltage V(ref) from the voltage source 401. The operational amplifier 411 may generate the voltage V(1) at the output terminal of the operational amplifier 411 according to the voltage V(ref).

A gate (G) terminal of the transistor element 412 is coupled to the output terminal of the operational amplifier 411. A source (S) terminal of the transistor element 412 is coupled to the mirror circuit 44 and the current source 402. The transistor element 412 may receive the voltage V(1) via the gate (G) terminal of the transistor element 412. The transistor element 412 may output the voltage V(2) via the source (S) terminal of the transistor element 412 according to the voltage V(1).

The compensating circuit 42 is coupled to the switch circuit 43. In the case where the compensating circuit 42 is turned on to the regulator circuit 41, the compensating circuit 42 may be configured to compensate the frequency response (for example, the high frequency response) of the regulator circuit 41. In addition, in the case where the compensating circuit 42 is not turned on to the regulator circuit 41 (that is, cut off from the regulator circuit 41), the compensating circuit 42 does not compensate the frequency response of the regulator circuit 41.

The switch circuit 43 is coupled to the regulator circuit 41, the compensating circuit 42, and the mirror circuit 44. The switch circuit 43 includes a transistor element 431 (that is, a second transistor element). A source (S) terminal of the transistor element 431 is coupled to the regulator circuit 41. A gate (G) terminal of the transistor element 431 is coupled to the mirror circuit 44. A drain (D) terminal of the transistor element 431 is coupled to the compensating circuit 42.

The transistor element 431 may receive the voltage V(1) via the source (S) terminal of the transistor element 431. The transistor element 431 may receive the voltage V(ctrl) via the gate (G) terminal of the transistor element 431. According to the voltage difference between the voltage V(1) and the voltage V(ctrl), the transistor element 431 may turn on or cut off the compensating circuit 42. In an exemplary embodiment, the voltage V(ctrl) is also referred to as a gate voltage of the transistor element 431. In addition, the threshold may be affected by the material characteristics and/or the electrical changes of the transistor element 431.

The mirror circuit 44 is coupled to the regulator circuit 41 and the switch circuit 43. The mirror circuit 44 includes a transistor element 441 (that is, a third transistor element) and a transistor element 442 (that is, a fourth transistor element). A source (S) terminal of the transistor element 441 is coupled to the regulator circuit 41 (for example, the source (S) terminal of the transistor element 412). A drain (D) terminal of the transistor element 441 is coupled to a current source 403. A gate (G) terminal of the transistor element 441 is coupled to a source (S) terminal of the transistor element 442. A gate (G) terminal of the transistor element 442 is coupled to the switch circuit 43 (for example, the gate (G) terminal of the transistor element 431). A drain (D) terminal of the transistor element 442 is coupled to a current source 404.

The transistor element 441 may receive the voltage V(2) via the source (S) terminal of the transistor element 441. The transistor element 441 may generate the voltage V(3) via the gate (G) terminal of the transistor element 441 according to the voltage V(2). The transistor element 442 may receive the voltage V(3) via the source (S) terminal of the transistor element 442. The transistor element 442 may generate the voltage V(ctrl) via the gate (G) terminal of the transistor element 442 according to the voltage V(3).

Similar to the exemplary embodiments of FIG. 2 and FIG. 3, in the exemplary embodiment of FIG. 4, the configurations of the transistor elements 441 and 442 correspond to the configurations of the transistor elements 412 and 431. Therefore, the transistor elements 441 and 442 may be used as mirror circuits of the transistor elements 412 and 431. Under the same operating environment (for example, ambient temperature and/or process errors), the transistor elements 441 and 442 may dynamically control the voltage V(ctrl) according to the voltage V(2) to reflect possible characteristic changes of the transistor element 431 (and 412) under the current operating environment, thereby improving the operating stability of the transistor element 431 (or the switch circuit 43).

Figure 5:
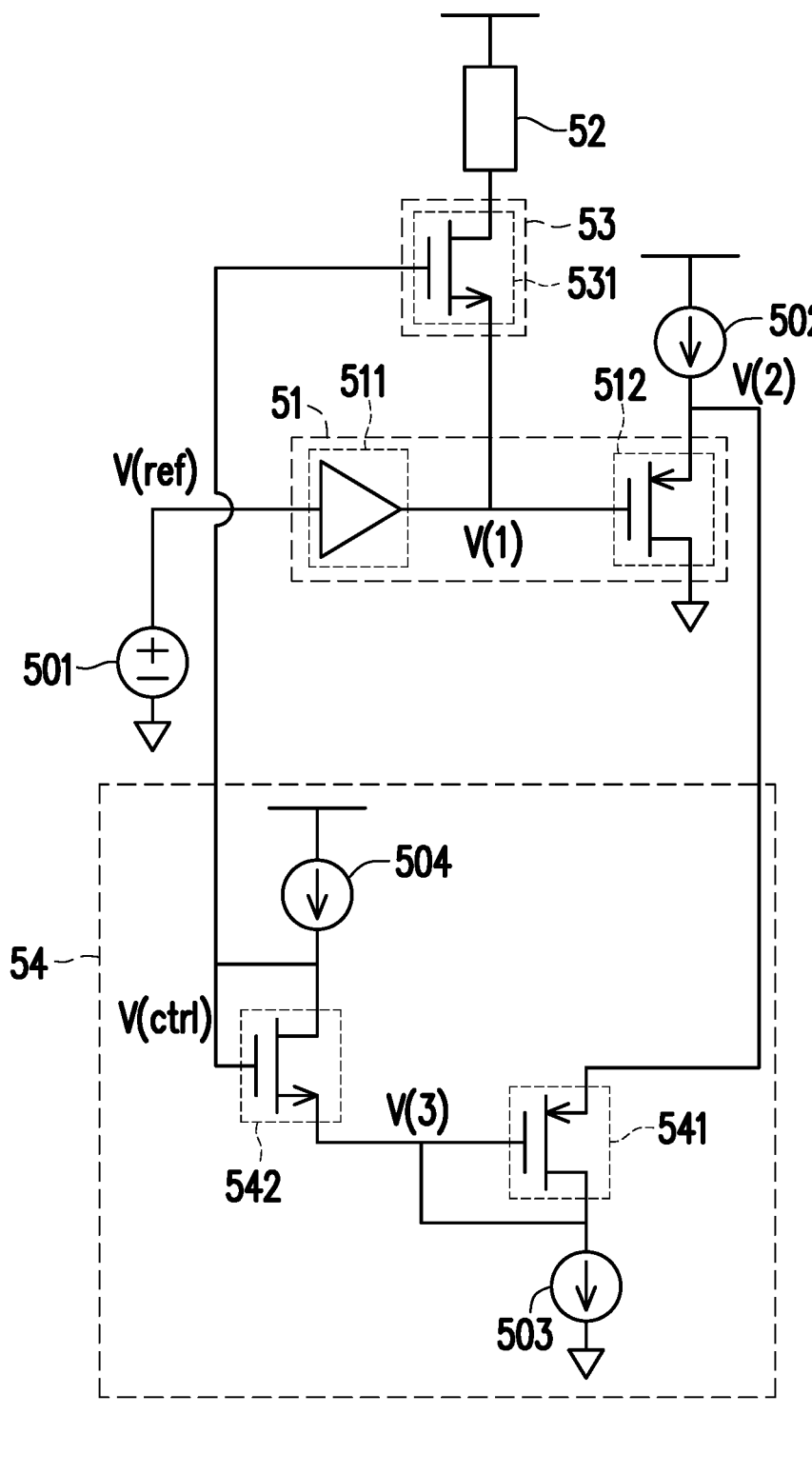
FIG. 5 is a schematic diagram of a regulator circuit module according to an exemplary embodiment of the disclosure.

FIG. 5 is a schematic diagram of a regulator circuit module according to an exemplary embodiment of the disclosure. Please refer to FIG. 5. A regulator circuit module 50 includes a regulator circuit 51, a compensating circuit 52, a switch circuit 53, and a mirror circuit 54.

The regulator circuit 51 includes an operational amplifier 511 and a transistor element 512 (that is, a second transistor element). An input terminal of the operational amplifier 511 is coupled to a voltage source 501. An output terminal of the operational amplifier 511 is coupled to the transistor element 512 and the switch circuit 53. The operational amplifier 511 may receive the voltage V(ref) from the voltage source 501. The operational amplifier 511 may generate the voltage V(1) at the output terminal of the operational amplifier 511 according to the voltage V(ref).

A gate (G) terminal of the transistor element 512 is coupled to the output terminal of the operational amplifier 511. A source (S) terminal of the transistor element 512 is coupled to the mirror circuit 54 and the current source 502. The transistor element 512 may receive the voltage V(1) via the gate (G) terminal of the transistor element 512. The transistor element 512 may output the voltage V(2) via the source (S) terminal of the transistor element 512 according to the voltage V(1).

The compensating circuit 52 is coupled to the switch circuit 53. In the case where the compensating circuit 52 is turned on to the regulator circuit 51, the compensating circuit 52 may be configured to compensate the frequency response (for example, the high frequency response) of the regulator circuit 51. Furthermore, in the case where the compensating circuit 52 is not turned on to the regulator circuit 51 (that is, cut off from the regulator circuit 51), the compensating circuit 52 does not compensate the frequency response of the regulator circuit 51.

The switch circuit 53 is coupled to the regulator circuit 51, the compensating circuit 52, and the mirror circuit 54. The switch circuit 53 includes a transistor element 531 (that is, a second transistor element). A source (S) terminal of the transistor element 531 is coupled to the regulator circuit 51. A gate (G) terminal of the transistor element 531 is coupled to the mirror circuit 54. A drain (D) terminal of the transistor element 531 is coupled to the compensating circuit 52.

The transistor element 531 may receive the voltage V(1) via the source (S) terminal of the transistor element 531. The transistor element 531 may receive the voltage V(ctrl) via the gate (G) terminal of the transistor element 531. According to the voltage difference between the voltage V(1) and the voltage V(ctrl), the transistor element 531 may turn on or cut off the compensating circuit 52. In an exemplary embodiment, the voltage V(ctrl) is also referred to as a gate voltage of the transistor element 531. In addition, the threshold may be affected by the material characteristics and/or the electrical changes of the transistor element 531.

The mirror circuit 54 is coupled to the regulator circuit 51 and the switch circuit 53. The mirror circuit 54 includes a transistor element 541 (that is, a third transistor element) and a transistor element 542 (that is, a fourth transistor element). A source (S) terminal of the transistor element 541 is coupled to the regulator circuit 51 (for example, the source (S) terminal of the transistor element 512). A drain (D) terminal of the transistor element 541 is coupled to a current source 503. A gate (G) terminal of the transistor element 541 is coupled to a source (S) terminal of the transistor element 542. A gate (G) terminal of the transistor element 542 is coupled to the switch circuit 53 (for example, the gate (G) terminal of the transistor element 531). A drain (D) terminal of the transistor element 542 is coupled to a current source 504.

The transistor element 541 may receive the voltage V(2) via the source (S) terminal of the transistor element 541. The transistor element 541 may generate the voltage V(3) via the gate (G) terminal of the transistor element 541 according to the voltage V(2). The transistor element 542 may receive the voltage V(3) via the source (S) terminal of the transistor element 542. The transistor element 542 may generate the voltage V(ctrl) via the gate (G) terminal of the transistor element 542 according to the voltage V(3).

Similar to the exemplary embodiments of FIG. 2 to FIG. 4, in the exemplary embodiment of FIG. 5, the configurations of the transistor elements 541 and 542 correspond to the configurations of the transistor elements 512 and 531. Therefore, the transistor elements 541 and 542 may be used as mirror circuits of the transistor elements 512 and 531. Under the same operating environment (for example, ambient temperature and/or process errors), the transistor elements 541 and 542 may dynamically control the voltage V(ctrl) according to the voltage V(2) to reflect possible characteristic changes of the transistor element 531 (and 512) under the current operating environment, thereby improving the operating stability of the transistor element 531 (or the switch circuit 53).

Please return to FIG. 1. In an exemplary embodiment, the mirror circuit 14 may be configured to reflect electrical changes of at least one transistor element in the regulator circuit 11 and the switch circuit 13 and act. For example, the mirror circuit 14 may reflect the detected electrical changes of the at least one transistor element in the regulator circuit 11 and the switch circuit 13 to the generated voltage V(ctrl) to overcome unexpected electrical changes in the switch circuit 13. In an exemplary embodiment, the electrical changes include changes in voltage between two terminal points of a transistor, and the voltage between the two terminal points of the transistor may include a gate-source voltage. Taking FIG. 2 as an example, the transistor element 241 (that is, the third transistor element) in the mirror circuit 24 may be configured to reflect the electrical changes of the transistor element 212 (that is, the first transistor element) in the regulator circuit 11 and/or the transistor element 242 (that is, the fourth transistor element) in the mirror circuit 24 may be configured to reflect the electrical changes of the transistor element 231 (that is, the second transistor element) in the switch circuit 13. In addition, the mirror circuits 34, 44, and 54 in FIG. 3 to FIG. 5 may also have similar characteristics, which will not be repeated here.

In an exemplary embodiment, the regulator circuit modules 10, 20, 30, 40, and 50 of FIG. 1 to FIG. 5 may all be applied in a low dropout regulator or a similar voltage control circuit module. In the following, the regulator circuit module 40 of FIG. 4 is disposed in a low dropout regulator as an example for illustration.

Figure 6:
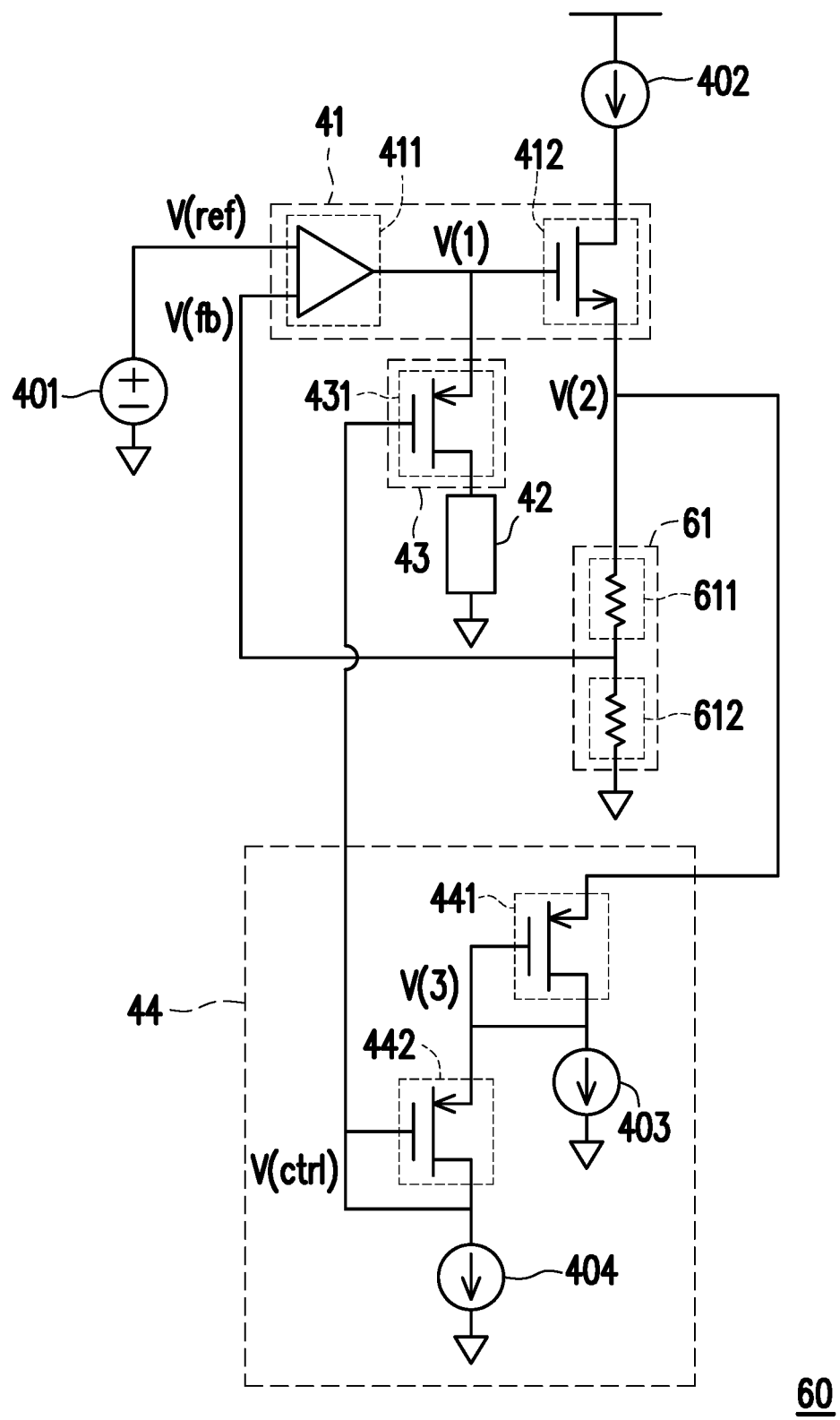
FIG. 6 is a schematic diagram of a regulator circuit module according to an exemplary embodiment of the disclosure.

FIG. 6 is a schematic diagram of a regulator circuit module according to an exemplary embodiment of the disclosure. Please refer to FIG. 6. Compared with the regulator circuit module 40 of FIG. 4, a regulator circuit module 60 further includes a feedback circuit 61.

The feedback circuit 61 is coupled to the regulator circuit 41. For example, the feedback circuit 61 may be coupled to the source (S) terminal of the transistor element 412 and the input terminal of the operational amplifier 411. The feedback circuit 61 is configured to generate a voltage V(fb) (also referred to as a feedback voltage) according to the voltage V(2) and feedback the voltage V(fb) to the regulator circuit 41.

In an exemplary embodiment, the feedback circuit 61 may include a voltage dividing circuit. The voltage dividing circuit includes impedance elements 611 and 612 connected in series. The impedance elements 611 and 612 may divide the voltage V(2) to generate the voltage V(fb). The operational amplifier 411 may receive voltages V(ref) and V(b). The operational amplifier 411 may generate the voltage V(1) according to the voltages V(ref) and V(b). For example, the operational amplifier 411 may generate the voltage V(1) according to a voltage difference between the voltages V(ref) and V(b). According to the voltage V(1), the transistor element 412 may correspondingly adjust the voltage V(2). Thereby, through setting the feedback circuit 61, the regulator circuit module 60 may keep the voltage value of the voltage V(2) stable.

It should be noted that in the exemplary embodiments of FIG. 1 to FIG. 6, the mutual coupling relationship between various electronic circuits (or electronic elements) may be adjusted according to practical requirements, which is not limited in the disclosure. Alternatively, more useful electronic circuits (or electronic elements) may also be appropriately added to the regulator circuit module or configured to replace specific electronic circuits (or electronic elements) in the regulator circuit module, which is not limited in the disclosure.

In an exemplary embodiment, the regulator circuit module may be disposed in a memory storage device. Alternatively, in an exemplary embodiment, the regulator circuit module may also be disposed in other types of electronic devices.

Figure 7:
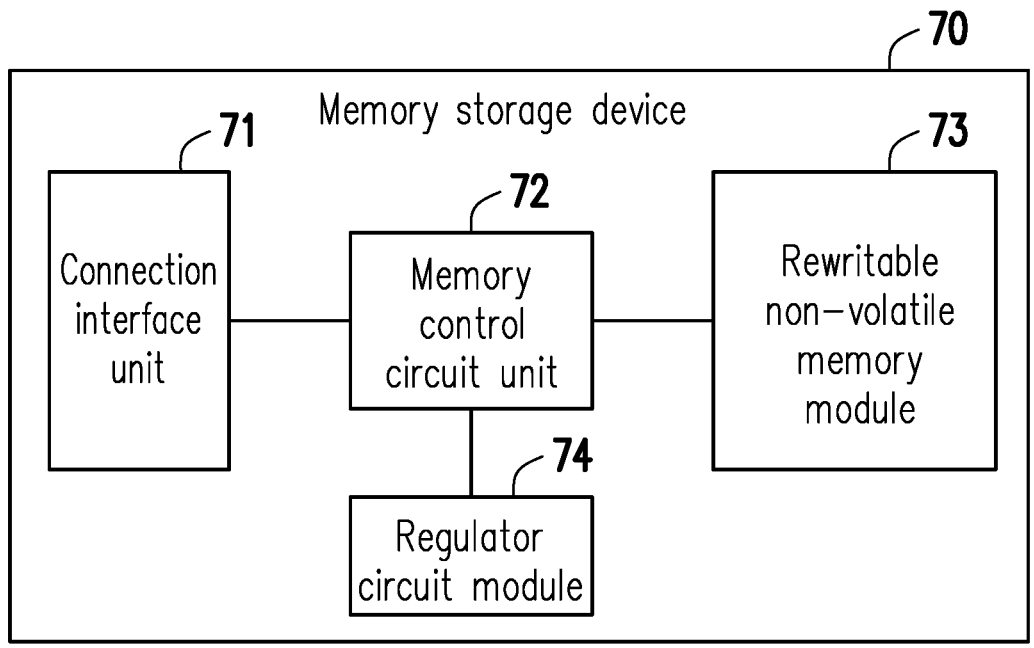
FIG. 7 is a schematic diagram of a memory storage device according to an exemplary embodiment of the disclosure.

FIG. 7 is a schematic diagram of a memory storage device according to an exemplary embodiment of the disclosure. Please refer to FIG. 7. A memory storage device 70 includes a connection interface unit 71, a memory control circuit unit 72, a rewritable non-volatile memory module 73, and a regulator circuit module 74.

The connection interface unit 71 is configured to couple the memory storage device 70 to a host system. The memory storage device 70 may communicate with the host system via the connection interface unit 71. In an exemplary embodiment, the connection interface unit 71 is compatible with the peripheral component interconnect express (PCI express) standard. In an exemplary embodiment, the connection interface unit 71 may also conform to the serial advanced technology attachment (SATA) standard, the parallel advanced technology attachment (PATA) standard, the Institute of Electrical and Electronic Engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 71 and the memory control circuit unit 72 may be packaged in one chip or the connection interface unit 71 may be arranged outside a chip including the memory control circuit unit 72.

The memory control circuit unit 72 is coupled to the connection interface unit 71 and the rewritable non-volatile memory module 73. The memory control circuit unit 72 is configured to execute multiple logic gates or control commands implemented in the form of hardware or the form of firmware and perform operations such as data writing, reading, and erasing in the rewritable non-volatile memory module 73 according to a command of the host system.

The rewritable non-volatile memory module 73 is configured to store data written by the host system. The rewritable non-volatile memory module 73 may include a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristics.

Each memory cell in the rewritable non-volatile memory module 73 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data to the memory cell" or "programming the memory cell". As the threshold voltage changes, each memory cell in the rewritable non-volatile memory module 73 has multiple storage statuses. Through applying a read voltage, it is possible to judge which storage status a memory cell belongs to, so as to obtain one or more bits stored in the memory cell.

In an exemplary embodiment, the memory cells of the rewritable non-volatile memory module 73 may constitute multiple physical programming units, and the physical programming units may constitute multiple physical erasing units. Specifically, the memory cells on the same word line may form one or more physical programming units. If one memory cell may store more than 2 bits, the physical programming units on the same word line may be at least classified into a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND flash memory, the write speed of the lower physical programming unit is greater than the write speed of the upper physical programming unit and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area includes multiple physical sectors for storing user data, and the redundancy bit area is configured to store system data (for example, management data such as an error correcting code). In an exemplary embodiment, the data bit area includes 32 physical sectors, and the size of one physical sector is 512 bytes (B). However, in other exemplary embodiments, the data bit area may also include 8, 16, more, or less physical sectors, and the size of each physical sector may also be greater or smaller. On the other hand, the physical erasing unit is the smallest unit of erasure. That is, each physical erasing unit includes the smallest number of memory cells to be erased together. For example, the physical erasing unit is a physical block.

The regulator circuit module 74 may include the regulator circuit module of FIG. 1 to FIG. 6. The regulator circuit module 74 may be disposed inside the memory storage device 70 and be coupled to at least one of the connection interface unit 71, the memory control circuit unit 72, and the rewritable non-volatile memory module 73 to execute relevant voltage control operations. Alternatively, the regulator circuit module 74 may also be disposed inside at least one of the connection interface unit 71, the memory control circuit unit 72, and the rewritable non-volatile memory module 73. For the implementation details of the regulator circuit module 74, please refer to the exemplary embodiments of FIG. 1 to FIG. 6, which will not be repeated here.

Figure 8:
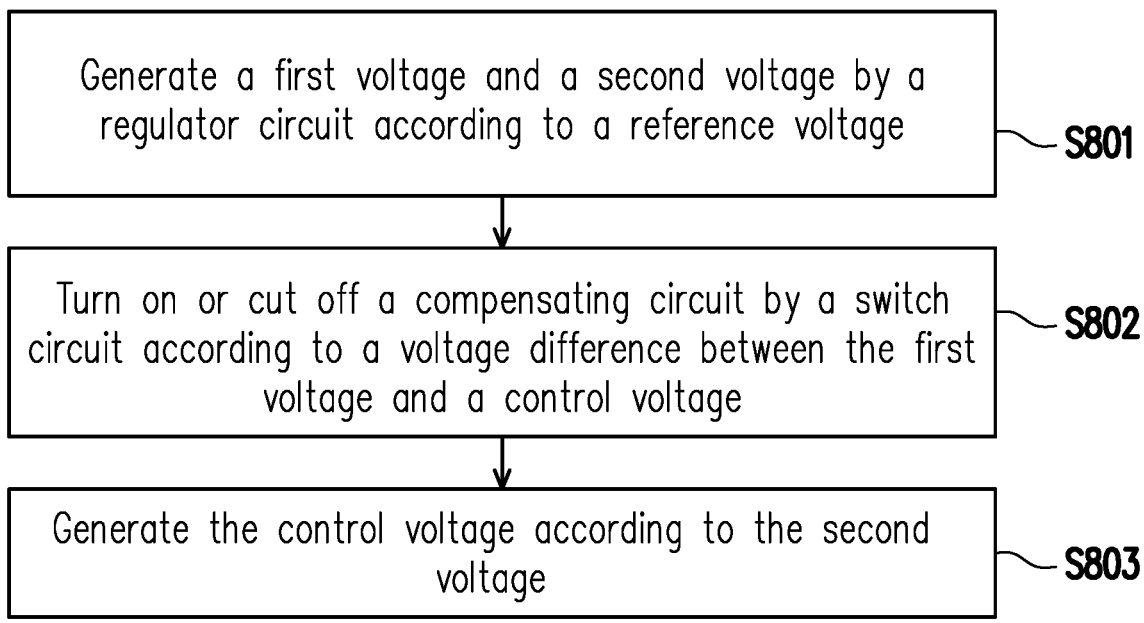
FIG. 8 is a flowchart of a voltage control method according to an exemplary embodiment of the disclosure.

FIG. 8 is a flowchart of a voltage control method according to an exemplary embodiment of the disclosure. Please refer to FIG. 8. In Step S801, a first voltage and a second voltage are generated by a regulator circuit according to a reference voltage. In Step S802, a compensating circuit is turned on or cut off by a switch circuit according to a voltage difference between the first voltage and a control voltage. In Step S803, the control voltage is generated according to the second voltage.

However, each step in FIG. 8 has been described in detail above and will not be repeated here. It should be noted that each step in FIG. 8 may be implemented as multiple program codes or circuits, which is not limited in the disclosure. In addition, the method of FIG. 8 may be used in combination with the above exemplary embodiments or may be used alone, which is not limited in the disclosure.

In summary, the regulator circuit module, the memory storage device, and the voltage control method provided by the embodiments of the disclosure may dynamically generate or adjust the control voltage of the switch circuit according to the output (that is, the second voltage) of the regulator circuit to reflect possible characteristic changes of the transistor element in the switch circuit under the current operating environment. Thereby, the operating stability of the switch circuit can be improved.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A regulator circuit module, comprising:
  a regulator circuit;
  a compensating circuit;
  a mirror circuit; and
  a switch circuit, coupled to the regulator circuit, the compensating circuit, and the mirror circuit, wherein
  the regulator circuit is configured to generate a first voltage and a second voltage according to a reference voltage,
  the switch circuit is configured to turn on or cut off the compensating circuit according to a voltage difference between the first voltage and a control voltage, and
  the mirror circuit is configured to generate the control voltage according to the second voltage.

2. The regulator circuit module according to claim 1, wherein the regulator circuit comprises:
  an operational amplifier, coupled to the switch circuit,
  wherein the operational amplifier is configured to:
    receive the reference voltage; and
    generate the first voltage at an output terminal of the operational amplifier according to the reference voltage.

3. The regulator circuit module according to claim 1, wherein the regulator circuit comprises:
  a first transistor element, coupled to the switch circuit and the mirror circuit,
  wherein the first transistor element is configured to:
    receive the first voltage via a first terminal of the first transistor element; and
    output the second voltage via a second terminal of the first transistor element according to the first voltage.

4. The regulator circuit module according to claim 1, wherein the switch circuit comprises:
  a second transistor element, coupled to the regulator circuit, the compensating circuit, and the mirror circuit,
  wherein the second transistor element is configured to:
    receive the first voltage via a first terminal of the second transistor element;
    receive the control voltage via a second terminal of the second transistor element; and
    turn on or cut off the compensating circuit coupled to a third terminal of the second transistor element according to the voltage difference between the first voltage and the control voltage.

5. The regulator circuit module according to claim 1, wherein the mirror circuit comprises:
  a third transistor element, coupled to the regulator circuit; and
  a fourth transistor element, coupled to the third transistor element and the switch circuit,
  wherein the third transistor element is configured to:
    receive the second voltage via a first terminal of the third transistor element; and
    generate a third voltage via a second terminal of the third transistor element according to the second voltage,
  wherein the fourth transistor element is configured to:
    receive the third voltage via a first terminal of the fourth transistor element; and
    generate the control voltage via a second terminal of the fourth transistor element according to the third voltage.

6. The regulator circuit module according to claim 1, wherein the regulator circuit comprises an operational amplifier and a first transistor element,
  the switch circuit comprises a second transistor element,
  an output terminal of the operational amplifier is coupled to a first terminal of the first transistor element and a first terminal of the second transistor element,
  a second terminal of the first transistor element and a second terminal of the second transistor element are coupled to the mirror circuit, and a third terminal of the second transistor element is coupled to the compensating circuit.

7. The regulator circuit module according to claim 6, wherein the mirror circuit comprises a third transistor element and a fourth transistor element,
   a first terminal of the third transistor element is coupled to the second terminal of the first transistor element,
   a second terminal of the third transistor element is coupled to a first terminal of the fourth transistor element, and
   a second terminal of the fourth transistor element is coupled to the second terminal of the second transistor element.

8. The regulator circuit module according to claim 1, wherein the compensating circuit is configured to compensate a frequency response of the regulator circuit.

9. The regulator circuit module according to claim 1, further comprising:
   a feedback circuit, coupled to the regulator circuit,
   wherein the feedback circuit is configured to generate a feedback voltage according to the second voltage and feedback the feedback voltage to the regulator circuit.

10. The regulator circuit module according to claim 1, wherein the mirror circuit is further configured to reflect an electrical change of at least one transistor element in the regulator circuit and the switch circuit and act.

11. The regulator circuit module according to claim 10, wherein a third transistor element in the mirror circuit is configured to reflect an electrical change of a first transistor element in the regulator circuit, and
   a fourth transistor element in the mirror circuit is configured to reflect an electrical change of a second transistor element in the switch circuit.

12. A memory storage device, comprising:
   a connection interface unit, configured to couple to a host system;
   a rewritable non-volatile memory module;
   a memory control circuit unit;
   a regulator circuit module, coupled to at least one of the connection interface unit, the rewritable non-volatile memory module, and the memory control circuit unit,
   wherein the regulator circuit module is configured to:
      generate a first voltage and a second voltage by a regulator circuit according to a reference voltage;
      turn on or cut off a compensating circuit by a switch circuit according to a voltage difference between the first voltage and a control voltage; and
      generate the control voltage according to the second voltage.

13. The memory storage device according to claim 12, wherein the regulator circuit comprises:
   an operational amplifier, coupled to the switch circuit,
   wherein the operational amplifier is configured to:
      receive the reference voltage; and
      generate the first voltage at an output terminal of the operational amplifier according to the reference voltage.

14. The memory storage device according to claim 12, wherein the regulator circuit comprises:
   a first transistor element, coupled to the switch circuit,
   wherein the first transistor element is configured to:
      receive the first voltage via a first terminal of the first transistor element; and
      output the second voltage via a second terminal of the first transistor element according to the first voltage.

15. The memory storage device according to claim 12, wherein the switch circuit comprises:
   a second transistor element, coupled to the regulator circuit and the compensating circuit,
   wherein the second transistor element is configured to:
      receive the first voltage via a first terminal of the second transistor element;
      receive the control voltage via a second terminal of the second transistor element; and
      turn on or cut off the compensating circuit coupled to a third terminal of the second transistor element according to the voltage difference between the first voltage and the control voltage.

16. The memory storage device according to claim 12, wherein the regulator circuit module comprises a mirror circuit, and the mirror circuit is configured to:
   receive the second voltage via a first terminal of a third transistor element;
   generate a third voltage via a second terminal of the third transistor element according to the second voltage;
   receive the third voltage via a first terminal of a fourth transistor element; and
   generate the control voltage via a second terminal of the fourth transistor element according to the third voltage.

17. The memory storage device according to claim 12, wherein the regulator circuit comprises an operational amplifier and a first transistor element,
   the switch circuit comprises a second transistor element,
   an output terminal of the operational amplifier is coupled to a first terminal of the first transistor element and a first terminal of the second transistor element,
   a second terminal of the first transistor element and a second terminal of the second transistor element are coupled to the mirror circuit, and
   a third terminal of the second transistor element is coupled to the compensating circuit.

18. The memory storage device according to claim 17, wherein the regulator circuit module comprises a mirror circuit,
   the mirror circuit comprises a third transistor element and a fourth transistor element,
   a first terminal of the third transistor element is coupled to the second terminal of the first transistor element,
   a second terminal of the third transistor element is coupled to a first terminal of the fourth transistor element, and
   a second terminal of the fourth transistor element is coupled to the second terminal of the second transistor element.

19. The memory storage device according to claim 12, wherein the compensating circuit is configured to compensate a frequency response of the regulator circuit.

20. The memory storage device according to claim 12, wherein the regulator circuit module is further configured to:
   generate a feedback voltage by a feedback circuit according to the second voltage; and
   feedback the feedback voltage to the regulator circuit.

21. The memory storage device according to claim 12, wherein the control voltage is generated by a mirror circuit in the regulator circuit module according to the second voltage, and the mirror circuit is configured to reflect an electrical change of at least one transistor element in the regulator circuit and the switch circuit and act.

22. The memory storage device according to claim 21, wherein a third transistor element in the mirror circuit is configured to reflect an electrical change of a first transistor element in the regulator circuit, and a fourth transistor element in the mirror circuit is configured to reflect an electrical change of a second transistor element in the switch circuit.

23. A voltage control method, applied to a regulator circuit module, the voltage control method comprising:
generating a first voltage and a second voltage by a regulator circuit according to a reference voltage;
turning on or cutting off a compensating circuit by a switch circuit according to a voltage difference between the first voltage and a control voltage; and
generating the control voltage according to the second voltage.

24. The voltage control method according to claim 23, wherein the step of generating the first voltage and the second voltage by the regulator circuit according to the reference voltage comprises:
receiving the reference voltage; and
generating the first voltage at an output terminal of an operational amplifier according to the reference voltage.

25. The voltage control method according to claim 23, wherein the step of generating the first voltage and the second voltage by the regulator circuit according to the reference voltage comprises:
receiving the first voltage via a first terminal of a first transistor element; and
outputting the second voltage via a second terminal of the first transistor element according to the first voltage.

26. The voltage control method according to claim 23, wherein the step of turning on or cutting off the compensating circuit by the switch circuit according to the voltage difference between the first voltage and the control voltage comprises:
receiving the first voltage via a first terminal of a second transistor element;
receiving the control voltage via a second terminal of the second transistor element; and
turning on or cutting off the compensating circuit coupled to a third terminal of the second transistor element according to the voltage difference between the first voltage and the control voltage.

27. The voltage control method according to claim 23, wherein the step of generating the control voltage according to the second voltage comprises:
receiving the second voltage via a first terminal of a third transistor element;
generating a third voltage via a second terminal of the third transistor element according to the second voltage;
receiving the third voltage via a first terminal of a fourth transistor element; and
generating the control voltage via a second terminal of the fourth transistor element according to the third voltage.

28. The voltage control method according to claim 23, wherein the regulator circuit comprises an operational amplifier and a first transistor element,
the switch circuit comprises a second transistor element,
an output terminal of the operational amplifier is coupled to a first terminal of the first transistor element and a first terminal of the second transistor element,
a second terminal of the first transistor element and a second terminal of the second transistor element are coupled to the mirror circuit, and
a third terminal of the second transistor element is coupled to the compensating circuit.

29. The voltage control method according to claim 28, wherein the regulator circuit module further comprises a mirror circuit,
the mirror circuit comprises a third transistor element and a fourth transistor element,
a first terminal of the third transistor element is coupled to the second terminal of the first transistor element,
a second terminal of the third transistor element is coupled to a first terminal of the fourth transistor element, and
a second terminal of the fourth transistor element is coupled to the second terminal of the second transistor element.

30. The voltage control method according to claim 23, wherein the compensating circuit is configured to compensate a frequency response of the regulator circuit.

31. The voltage control method according to claim 23, further comprising:
generating a feedback voltage by a feedback circuit according to the second voltage; and
feedbacking the feedback voltage to the regulator circuit.

32. The voltage control method according to claim 23, wherein the control voltage is generated by a mirror circuit in the regulator circuit module according to the second voltage, and the mirror circuit is configured to reflect an electrical change of at least one transistor element in the regulator circuit and the switch circuit and act.

33. The voltage control method according to claim 32, wherein a third transistor element in the mirror circuit is configured to reflect an electrical change of a first transistor element in the regulator circuit, and
a fourth transistor element in the mirror circuit is configured to reflect an electrical change of a second transistor element in the switch circuit.

* * * * *